United States Patent
ShangGuan et al.

(10) Patent No.: US 10,418,163 B2
(45) Date of Patent: Sep. 17, 2019

(54) DEVICES WITH COMBINED UNBALANCED CURRENT SENSOR AND SOLENOID COIL

(71) Applicant: Haier US Appliance Solutions, Inc., Wilmington, DE (US)

(72) Inventors: Weifeng ShangGuan, Shanghai (CN); Hely Zhang, Shanghai (CN); Roland Chen, Kunshan (CN); Yuan Yuan, Shanghai (CN); Gregory Francis Gawron, Sr., Jeffresontown, KY (US); Robert J. Zanelli, Louisville, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 176 days.

(21) Appl. No.: 15/128,457

(22) PCT Filed: Jul. 16, 2014

(86) PCT No.: PCT/CN2014/082305
§ 371 (c)(1),
(2) Date: Sep. 23, 2016

(87) PCT Pub. No.: WO2016/008113
PCT Pub. Date: Jan. 21, 2016

(65) Prior Publication Data
US 2018/0174726 A1   Jun. 21, 2018

(51) Int. Cl.
*H01F 7/06* (2006.01)
*H02H 3/16* (2006.01)
(Continued)

(52) U.S. Cl.
CPC ......... *H01F 7/064* (2013.01); *G01R 19/0092* (2013.01); *H01F 27/24* (2013.01);
(Continued)

(58) Field of Classification Search
CPC ....... H01F 7/064; H02H 3/162; H02H 1/0007
See application file for complete search history.

(56) References Cited

U.S. PATENT DOCUMENTS

| 4,219,875 A | 8/1980 | Haraldsson et al. |
| 4,229,775 A | 10/1980 | Miller |

(Continued)

FOREIGN PATENT DOCUMENTS

| CN | 2626105 Y | 7/2004 |
| GB | 2238921 A | 6/1991 |
| JP | S 57151865 | 9/1982 |

OTHER PUBLICATIONS

PCT CN/2014/082305 International Search Report dated Mar. 27, 2015.

*Primary Examiner* — Scott Bauer
(74) *Attorney, Agent, or Firm* — Dority & Manning, P.A.

(57) ABSTRACT

A device with a combined unbalanced current sensor and solenoid coil is provided. The device includes a core (116). The core (116) comprises a ferromagnetic material. The core (116) substantially surrounds a first conductor (102) and a second conductor (104) that conduct power to and from a load (106). The device includes a coil (118) that is wrapped around at least a portion of the core (116), such that an unbalanced current between the first and second conductors (102, 104) creates a first magnetic field that induces a first voltage on the coil (118). The coil (118) is positioned adjacent to a mechanical action part (124), such that application of a second voltage to the coil (118) creates a second magnetic field that influences the mechanical action part (124) to move from a first position to a second position that electrically disconnects the load (106) from a power source, such that the coil (118) serves as both an unbalanced current sensor coil and a solenoid coil.

16 Claims, 4 Drawing Sheets

(51) Int. Cl.
*H01H 83/14* (2006.01)
*H02H 3/33* (2006.01)
*G01R 19/00* (2006.01)
*H01F 27/24* (2006.01)
*H01F 27/28* (2006.01)
*H02H 1/00* (2006.01)

(52) U.S. Cl.
CPC ............ *H01F 27/28* (2013.01); *H01H 83/14* (2013.01); *H02H 1/0007* (2013.01); *H02H 3/162* (2013.01); *H02H 3/33* (2013.01)

(56) References Cited

U.S. PATENT DOCUMENTS

| | | | |
|---|---|---|---|
| 4,956,743 | A | 9/1990 | Hasegawa |
| 6,292,337 | B1 | 9/2001 | Legatti et al. |
| 7,652,566 | B2 | 1/2010 | Lee et al. |
| 7,672,098 | B2 | 3/2010 | Zhang et al. |
| 7,973,535 | B2 | 7/2011 | Lewinski et al. |
| 8,072,716 | B2 | 12/2011 | Lee |
| 8,189,307 | B2 | 5/2012 | Lee et al. |
| 8,446,699 | B2 | 5/2013 | Jackson |
| 8,456,782 | B2 | 6/2013 | Annis et al. |
| 2006/0132269 | A1* | 6/2006 | Kadah ............... H01H 9/56 335/128 |
| 2006/0170428 | A1* | 8/2006 | Richter ............... H02H 5/10 324/536 |
| 2010/0265630 | A1* | 10/2010 | Baxter ............... H01F 38/30 361/209 |

* cited by examiner

DEVICES WITH COMBINED UNBALANCED CURRENT SENSOR AND SOLENOID COIL

FIELD OF THE INVENTION

The present disclosure relates generally to devices for detection of and response to unbalanced current. In particular, the present disclosure is directed to devices that feature a combined unbalanced current sensor and solenoid coil.

BACKGROUND OF THE INVENTION

A leakage of current between a conductor carrying power to or from a device and a ground is known as a "ground fault," and poses dangers to humans as well the device itself. For example, if a human operator is in electrical contact with the ground, the human may receive an electrical shock or otherwise be injured. Likewise, ground faults can also cause overheating, fires, or other damage to the device itself.

As such, systems for detecting and responding ground faults have been developed. In particular, ground fault circuit interrupter systems can be included in devices such as home appliances to protect against ground faults.

Certain existing ground fault circuit interrupter systems typically include both an unbalanced current sensor and a relay. The unbalanced current sensor can include a sensor coil for detecting an unbalanced current between conductors carrying power to and from the device.

When unbalanced current is detected, the relay can be operated to electrically disconnect the device load from the power source. Relays also typically include a solenoid coil that can be energized to generate a magnetic field to influence one or more mechanical parts of the relay to move to a different position that causes the electrical disconnection.

Thus, existing unbalanced current detection and response systems include both a sensor coil and a solenoid coil. Each of such coils has a cost to manufacture or purchase and, therefore, increases the cost of the resulting system and device.

Therefore, devices that feature a combined unbalanced current sensor and solenoid coil are desirable.

BRIEF DESCRIPTION OF THE INVENTION

Aspects and advantages of the invention will be set forth in part in the following description, or may be obvious from the description, or may be learned through practice of the invention.

One aspect of the present disclosure is directed to a device for detecting and responding to an unbalanced current. The device includes a core. The core comprises a ferromagnetic material. The core substantially surrounds a first conductor and a second conductor that conduct power to and from a load. The device includes a coil that is wrapped around at least a portion of the core, such that an unbalanced current between the first and second conductors creates a first magnetic field that induces a first voltage on the coil. The coil is positioned adjacent to a mechanical action part, such that application of a second voltage to the coil creates a second magnetic field that influences the mechanical action part to move from a first position to a second position that electrically disconnects the load from a power source, such that the coil serves as both an unbalanced current sensor coil and a solenoid coil.

Another aspect of the present disclosure is directed to a method for detecting and responding to an unbalanced current. The method includes detecting a first voltage at a coil that is wrapped around at least a portion of a core. The core substantially surrounds a first conductor and a second conductor that conduct power to and from a load. The first voltage at the coil indicates that an unbalanced current exists between the first and second conductors. The method includes, in response to detecting the first voltage at the coil, applying a second voltage to the coil so as to create a magnetic field that influences a mechanical action part that is adjacent to the coil to move from a first position to a second position that electrically disconnects the load from a power source, such that the coil serves as both an unbalanced current sensor coil and a solenoid coil.

Another aspect of the present disclosure is directed to a system for performing ground fault circuit interruption. The system includes an unbalanced current sensor. The unbalanced current sensor includes a core that at least partially surrounds a first conductor and a second conductor that conduct power to and from a load. The unbalanced current sensor includes a coil that is wrapped around at least a portion of the core, such that an unbalanced current between the first and second conductors creates a first magnetic field that induces a first voltage on the coil. The system includes an electronics drive circuit configured to detect the first voltage at the coil and, when the first voltage is detected at the coil, apply a second voltage to the coil. The system includes a mechanical action part. Application of the second voltage to the coil creates a second magnetic field that influences the mechanical action part to move from a first position to a second position that electrically disconnects the load from a power source, such that the coil serves as both an unbalanced current sensor coil and a solenoid coil for influencing movement of the mechanical action part.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Figure 1:
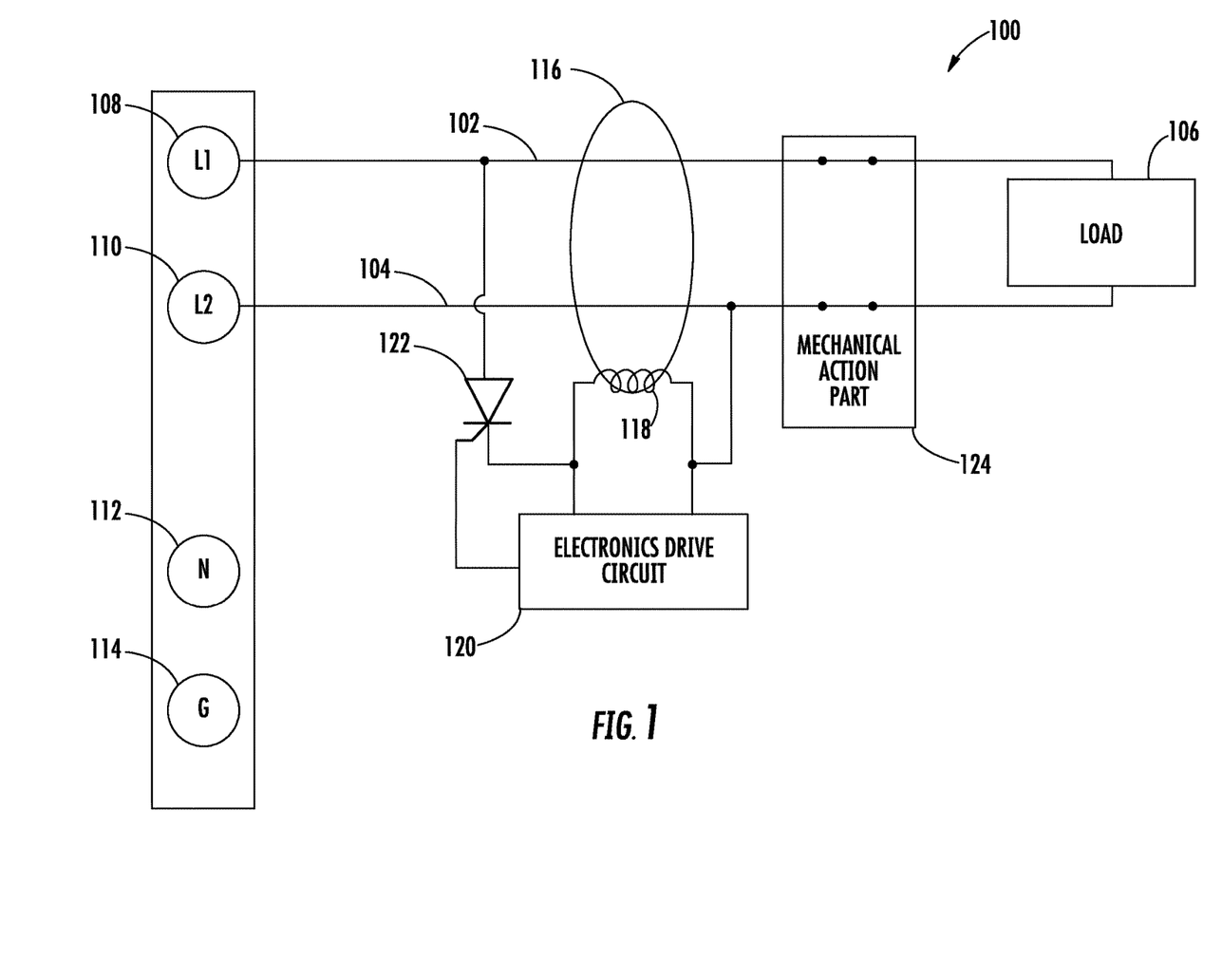
FIG. 1 depicts a block diagram of an example system according to an example embodiment of the present disclosure.

FIG. 1 depicts a block diagram of an example system 100 according to an example embodiment of the present disclosure. In particular, system 100 features a combined unbalanced current sensor and solenoid coil.

System 100 can include a first conductor 102 and a second conductor 104 that carry power to and from a load 106. As shown in FIG. 1, first conductor 102 and second conductor 104 can be respectively connected to a first line input 108 and a second line input 110. In some embodiments of the illustrated configuration, the load 106 may cumulatively receive power at about 240 volts from conductors 102 and 104. The system may also include a neutral conductor 112 and a ground 114.

In other embodiments of the present disclosure, the second conductor 104 can be connected to the neutral conductor 112 instead of the second line input 110. In some embodiments having such configuration, the load 106 may receive power at about 120 volts. One of skill in the art will be familiar with the various available power configurations described above.

As an example, the system 100 can be included within or external to a home appliance. Thus, for example, the load 106 can be a component of a home appliance, such as a heating element, a fan, a motor, or other components that require energization.

System 100 can include an unbalanced current sensor for detecting when an unbalanced current exists between first and second conductors 102 and 104. For example, an unbalanced current can exist when there is a leakage of current from the first line input 108 to ground 114 or from the second line input 110 to ground 114.

The unbalanced current sensor can include a core 116 and a coil 118 that wraps around at least a portion of the core 116.

The core 116 can be made of a ferromagnetic material such as, for example, iron. The core can at least partially surround the first and second conductors 102 and 104. For example, the core 116 can substantially surround the two conductors 102 and 104 such that a first magnetic field created by an unbalanced current between the first and second conductors 102 and 104 induces a first voltage on the coil 118.

The voltage across coil 118 can be read by or otherwise provided to an electronics drive circuit 120. The electronics drive circuit 120 can monitor the voltage across coil 118 to identify when an unbalanced current exists. For example, if the voltage across coil 118 remains above a predetermined threshold voltage for longer than a predetermined amount of time, then electronics drive circuit 120 can determine that an unbalanced current condition exists and respond appropriately. Thus, when providing such functionality, the coil 118 is used as an unbalanced current sensor coil.

In particular, when electronics drive circuit 120 determines that an unbalanced current exists between conductors 102 and 104, then electronics drive circuit 120 can trigger a switching element 122 so as to provide a second voltage across the coil 118. The second voltage can be of a larger magnitude than the first voltage. For example, the switching element 122 can be a silicon controlled rectifier, as illustrated in FIG. 1.

As an example, electronics drive circuit 120 can include a comparator that compares the voltage across coil 118 to a reference voltage. When the voltage across coil 118 exceeds the reference voltage, then the comparator can output a high signal that serves to activate the silicon controlled rectifier 122, thereby allowing the flow of energy from conductor 102 to the coil 118. However, other sources for the second voltage can be used as well.

Coil 118 can be positioned adjacent to a mechanical action part 124, and together may operate as components of a relay or other switching device. In particular, the mechanical action part 124 can be movable between a first position and a second position. The first position of mechanical action part 124 can electrically connect the load 106 to first and second conductors 102 and 104. On the other hand, the second position of mechanical action part 124 can electrically disconnect the load 106 from the first and second conductors 102 and 104.

Application of the second, larger voltage to the coil 118 can cause coil 118 to generate a second magnetic field. The mechanical action part 124 can be made of a ferromagnetic material, such as, for example, iron. Due to the magnetic properties of mechanical action part 124, the second magnetic field can influence (e.g. push or pull) the mechanical action part 124 from the first position to the second position, thereby electrically disconnecting the load 106 from the power source. Thus, when providing such functionality, the coil 118 is used as a solenoid coil of a relay.

As outlined above, system 100 may operate as follows. During normal operation, mechanical action part 124 may be in a first position that ensures respective electrical connection between first and second conductors 102 and 104 and the load 106, such that the load 106 receives power from the power source.

When there is a leakage current between conductor 102 and ground 114 or between conductor 104 and ground 114, an unbalanced current will exist between conductors 102 and 104. The unbalanced current will generate a first magnetic field that will be observed by core 116 and induce a first voltage across coil 118.

Electronics drive circuit 120 can detect the unbalanced current condition based on the first voltage across coil 118. In response, the electronics driver circuit 120 can trigger the silicon controlled rectifier, thereby allowing the flow of energy from conductor 102 to coil 118 and providing a second, larger voltage across coil 118.

Application of the second voltage to coil 118 can result in the generation of a second magnetic field of greater magnitude. The second magnetic field can influence the mechanical action part 124 to move from the first position to a second position that electrically disconnects the load 106 from the power source, thereby resolving the ground fault and corresponding unbalanced current condition. In such fashion, the coil 118 of system 100 can serve as both an unbalanced current sensor coil and a solenoid coil for influencing movement of the mechanical action part.

Figure 2:
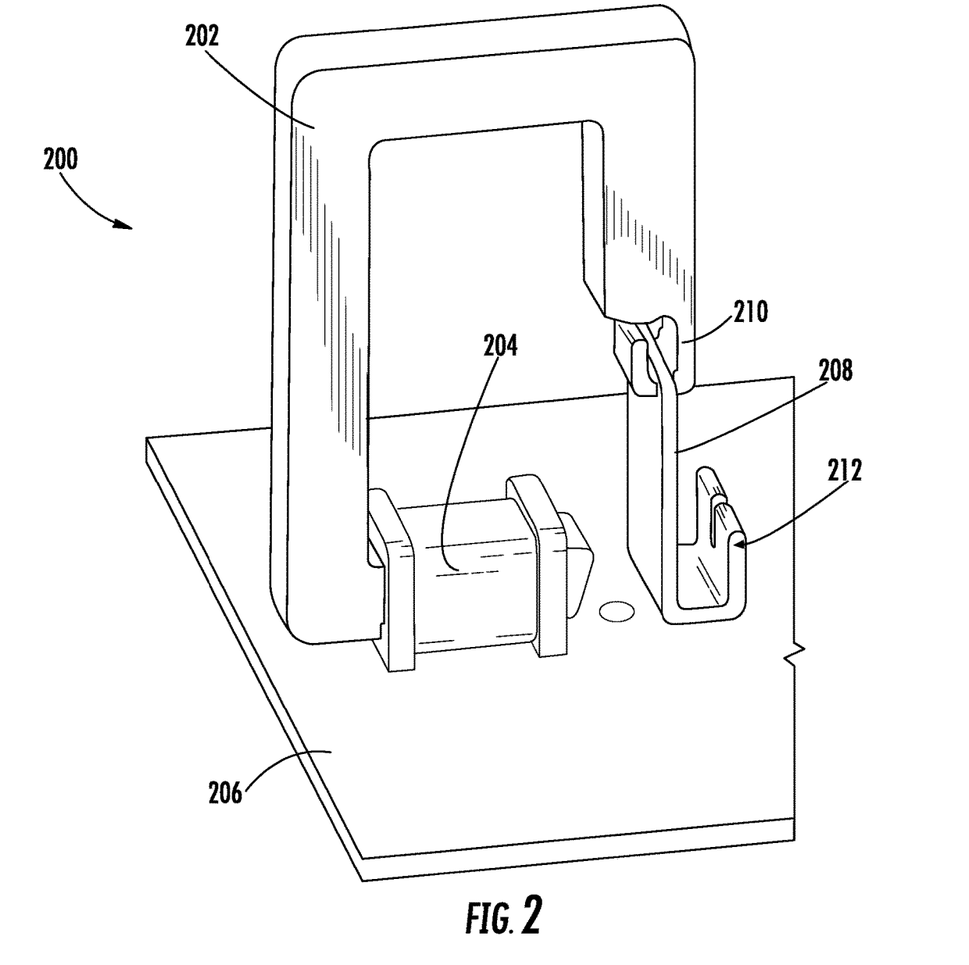
FIG. 2 depicts an example device according to an example embodiment of the present disclosure.

FIG. 2 depicts an example device 200 according to an example embodiment of the present disclosure. In particular, device 200 features a combined unbalanced current sensor and solenoid coil. Device 200 is provided as one example device for implementing the present disclosure. Other designs may be used to perform the present disclosure as well.

Device 200 can include a core 202. The core 202 can at least partially surround two conductors (not shown) that carry power to and from a load. The core 202 can be formed from a ferromagnetic material, such as, for example, iron. As shown in FIG. 2, the core can be, for example, three-quarters of a closed loop.

Device 200 can also include a coil 204. The coil 204 can be wrapped around at least a portion of the core 202. The coil 204 and the core 202 can be connected to a printed circuit board 206.

In some embodiments, as shown in FIG. 2, the core 202 can be a support arm 202 that is connected to a mechanical action part 208. For example, the support arm 202 can include at a first end of the arm a hook 210 from which the mechanical action part 208 hangs. Thus, in embodiments in which the mechanical action part 208 hangs from hook 210, mechanical action part 208 can be considered as a swing 208.

The swing 208 can hang in the first position when a magnetic field is not actively generated by coil 204. When coil 204 generates a magnetic field of significant magnitude to influence movement by swing 208, the swing 208 can be pulled into a second position.

In certain embodiments having particular dimensions, when the swing 208 is pulled into the second position, the bottom of the swing 208 can come into contact with a second end of the support arm 202, thereby forming a closed loop. However, in other embodiments having other dimensions, the formation of a closed loop by swing 208 and support arm 202 is not possible.

Thus, in some embodiments, the mechanical action part 208 can be thought of as a movable portion of the core 202.

When the swing 208 is pulled into the second position, it can cause a load to be electrically disconnected from a power source, thereby resolving a current leakage or other unbalanced current event. In some embodiments, after the unbalanced current event is resolved, the application of energy to the coil 204 for the purposes of generating the magnetic field for influencing movement of swing 208 can be discontinued. Thus, in some embodiments, swing 208 may be influenced by gravity to return to the first position after the magnetic field dissipates. However, in other embodiments, the system may be designed so that, once swing 208 is pulled into the second position, a manual reset is required to allow swing 208 to return to the first position.

In some embodiments, the mechanical action part 208 can have a claw 212 at a second end that is not connected to the support arm 202. The claw can be designed to pull another component, as will be discuss further with respect to FIGS. 3 and 4.

Although FIG. 2 illustrated the device 200 with the support arm 202 arranged vertically such that the mechanical action part 208 hangs from the hook 210, such configuration is provided as an example only. In some embodiments of the present disclosure, the support arm 202 and mechanical action part 208 may be arranged horizontally, or in other configurations.

Figure 3:
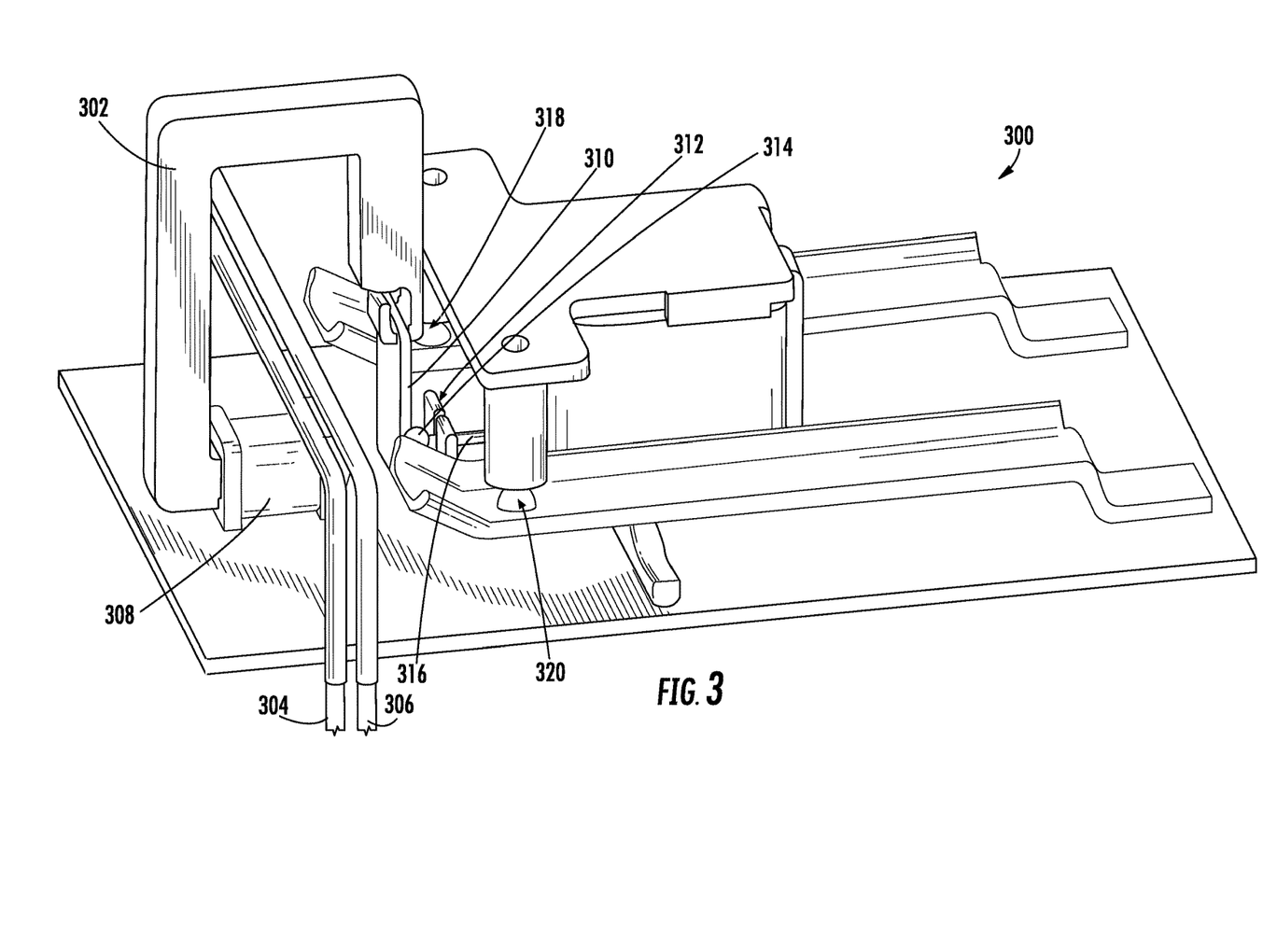
FIG. 3 depicts an example system according to an example embodiment of the present disclosure.

FIG. 3 depicts an example system 300 according to an example embodiment of the present disclosure. System 300 can include a device that features a combined unbalanced current sensor and solenoid coil. System 300 is provided as one example system for implementing the present disclosure. Other designs may be used to perform the present disclosure as well.

System 300 can include a core 302 that at least partially surrounds a first conductor 304 and a second conductor 306. A coil 308 can be wrapped around at least a portion of core 302.

Core 302 can substantially surround the conductors 304 and 306 such that a first magnetic field generated by an unbalanced current between conductors 304 and 306 induces a first voltage across the coil 308.

A mechanical action part 310 can be positioned adjacent to the coil 308. As an example, as illustrated in FIG. 3, the mechanical action part 310 can be a swing that hangs from a hook of the core 302.

In some embodiments, the mechanical action part 310 can be made from the same material as the core 302. As such, in some embodiments, the mechanical action part 310 can be considered as a movable portion of the core 302.

The mechanical action part 310 can have a claw 312 configured to pull an object. For example, as illustrated in FIG. 3, a head 314 of a rod 316 can be positioned interior to the claw 312. The rod 316 can pass through an opening the claw 312 defined by two prongs of the claw 312.

Figure 4:
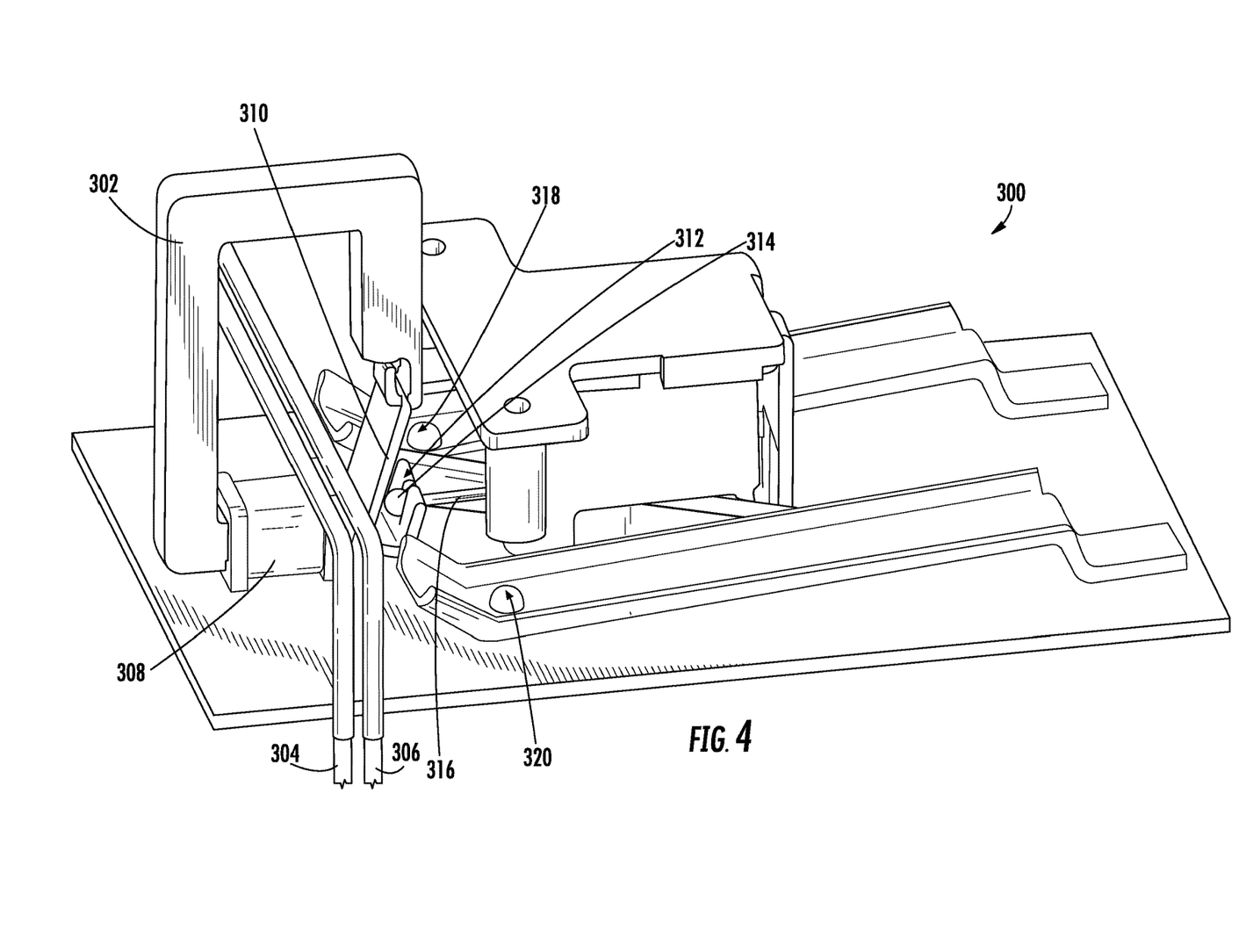
FIG. 4 depicts an example system according to an example embodiment of the present disclosure.

The mechanical action part 310 can be movable between a first position (shown in FIG. 3) and a second position (shown in FIG. 4). When the mechanical action part 310 is in the first position, respective electrical connections can be secured between the conductors 304 and 306 and a load (not shown). In particular, electrical connections can be secured at points 318 and 320.

When a second, larger voltage is applied to the coil 308, a second magnetic field can be generated that influences (e.g. pulls) the mechanical action part 310 into the second position.

FIG. 4 depicts the example system 300 according to an example embodiment of the present disclosure. In particular, FIG. 4 depicts the example system 300 after the mechanical action part 310 has been pulled into the second position.

More particularly, when the mechanical action part 310 is pulled into the second position, the claw 312 pulls on the head 314 of rod 316. By pulling rod 316, the electrical connections at 318 and 320 can be eliminated, thereby disconnecting the load from the power source.

In such fashion, dangerous situations that result in unbalanced current can be identified and resolved. In particular, coil 308 can advantageously be used as both an unbalanced current sensor coil and a solenoid coil for operating a mechanical relay.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A device for detecting and responding to an unbalanced current, the device comprising:
   a core, wherein the core comprises a ferromagnetic material, and wherein the core substantially surrounds a first conductor and a second conductor that conduct power to and from a load, the core further comprising a support arm having a hook;
   a coil that is wrapped around at least a portion of the core, such that an unbalanced current between the first and second conductors creates a first magnetic field that induces a first voltage on the coil; and
   a mechanical action part to which the support arm is connected, the mechanical action part comprising a swing that hangs from the hook of the support arm;
   wherein the coil is positioned adjacent to the mechanical action part, such that application of a second voltage to the coil creates a second magnetic field that influences the mechanical action part to move from a first position to a second position that electrically disconnects the load from a power source, such that the coil serves as both an unbalanced current sensor coil and a solenoid coil;

wherein the swing hangs in the first position when the second magnetic field is not present; and when the second magnetic field is created, the swing is pulled into the second position.

2. The device of claim 1, wherein:
the hook is located at a first end of the support arm; and
a top of the swing hangs from the hook.

3. The device of claim 2, wherein, when the swing is pulled into the second position, a bottom of the swing contacts a second end of the support arm, thereby forming a closed loop.

4. The device of claim 1, wherein the mechanical action part comprises a movable portion of the core.

5. The device of claim 1, further comprising an electronics drive circuit that:
detects the first voltage across the coil; and
when the first voltage is detected across the coil, applies the second voltage across the coil;
wherein the second voltage is greater than the first voltage.

6. The device of claim 5, wherein the electronics drive circuit applies the second voltage across the coil by electrically connecting one or more of the first conductor and the second conductor to the coil.

7. The device of claim 1, wherein the first and second conductors respectively comprise a first line input and a second line input or a first line input and a neutral conductor.

8. The device of claim 1, wherein the core comprises three-quarters of a closed loop that surrounds the first and second conductors.

9. The device of claim 1, wherein the load comprises a component of a home appliance.

10. A device for detecting and responding to an unbalanced current, the device comprising:
a core, wherein the core comprises a ferromagnetic material, and wherein the core substantially surrounds a first conductor and a second conductor that conduct power to and from a load;
a mechanical action part;
a coil that is wrapped around at least a portion of the core, such that an unbalanced current between the first and second conductors creates a first magnetic field that induces a first voltage on the coil, wherein the coil is positioned adjacent to the mechanical action part, such that application of a second voltage to the coil creates a second magnetic field that influences the mechanical action part to move from a first position to a second position that electrically disconnects the load from a power source, such that the coil serves as both an unbalanced current sensor coil and a solenoid coil;
a first end of the mechanical action part is connected to the support arm; and,
wherein the mechanical action part comprises a claw at a second end, wherein a head of a rod is positioned interior to the claw and the rod passes through an opening in the claw, such that when the mechanical action part moves from the first position to the second position, the head of the rod is pulled by the claw, the rod electrically disconnecting the load from a power source when pulled by the claw.

11. A method for detecting and responding to an unbalanced current, the method comprising:
detecting a first voltage at a coil that is wrapped around at least a portion of a core, wherein the core substantially surrounds a first conductor and a second conductor that conduct power to and from a load, the first voltage at the coil indicating that an unbalanced current exists between the first and second conductors;
in response to detecting the first voltage at the coil, applying a second voltage to the coil so as to create a magnetic field that influences a mechanical action part that is adjacent to the coil to move from a first position to a second position that electrically disconnects the load from a power source, such that the coil serves as both an unbalanced current sensor coil and a solenoid coil;
wherein:
the core comprises a support arm;
the mechanical action part comprises a swing that hangs from a hook of the support arm;
the swing hangs in the first position when the magnetic field is not present; and
when the magnetic field is created, the swing is pulled into the second position.

12. The method of claim 11, wherein applying the second voltage to the coil comprises electrically connecting the first conductor or the second conductor to the coil.

13. The method of claim 12, wherein the first and second conductors respectively comprise a first line input and a second line input or a first line input and a neutral conductor.

14. A system for performing ground fault circuit interruption, the system comprising:
an unbalanced current sensor comprising:
a core that at least partially surrounds a first conductor and a second conductor that conduct power to and from a load; and
a coil that is wrapped around at least a portion of the core, such that an unbalanced current between the first and second conductors creates a first magnetic field that induces a first voltage on the coil;
an electronics drive circuit configured to:
detect the first voltage at the coil; and
when the first voltage is detected at the coil, apply a second voltage to the coil; and
a mechanical action part;
wherein application of the second voltage to the coil creates a second magnetic field that influences the mechanical action part to move from a first position to a second position that electrically disconnects the load from a power source, such that the coil serves as both an unbalanced current sensor coil and a solenoid coil for influencing movement of the mechanical action part;
wherein the core comprises a support arm;
the mechanical action part comprises a swing that hangs from a hook of the support arm;
the swing hangs in the first position when the second magnetic field is not present; and
when the second magnetic field is created, the swing is pulled into the second position.

15. The system of claim 14, wherein:
a first end of the swing hangs from the hook; and
the swing comprises a claw at a second end, wherein a head of a rod is positioned interior to the claw and the rod passes through an opening in the claw, such that when the swing is pulled into the second position, the head of the rod is pulled by the claw, the rod electrically disconnecting the load from a power source when pulled by the claw.

16. The system of claim 14, wherein the electronics drive circuit applies the second voltage to the coil by electrically connecting one or more of the first conductor and the second conductor to the coil.

\* \* \* \* \*